(12) United States Patent
Morosawa

(10) Patent No.: US 10,804,404 B2
(45) Date of Patent: Oct. 13, 2020

(54) THIN FILM TRANSISTOR ARRAY PANEL AND MANUFACTURING METHOD THEREOF

(71) Applicant: Samsung Display Co., Ltd., Yongin-si (KR)

(72) Inventor: Narihiro Morosawa, Asan-si (KR)

(73) Assignee: SAMSUNG DISPLAY CO; LTD., Gyeonggi-Do (KR)

(*) Notice: Subject to any disclaimer, the term of this patent is extended or adjusted under 35 U.S.C. 154(b) by 0 days.

(21) Appl. No.: 15/714,728

(22) Filed: Sep. 25, 2017

(65) Prior Publication Data

US 2018/0090620 A1 Mar. 29, 2018

(30) Foreign Application Priority Data

Sep. 29, 2016 (KR) .................. 10-2016-0125246

(51) Int. Cl.
*H01L 29/786* (2006.01)
*H01L 21/02* (2006.01)
*H01L 27/12* (2006.01)
*H01L 27/32* (2006.01)
*H01L 29/66* (2006.01)

(52) U.S. Cl.
CPC .. *H01L 29/78606* (2013.01); *H01L 21/02175* (2013.01); *H01L 21/02178* (2013.01); *H01L 21/02181* (2013.01); *H01L 21/02186* (2013.01); *H01L 21/02189* (2013.01); *H01L 21/02194* (2013.01); *H01L 21/02244* (2013.01); *H01L 27/127* (2013.01); *H01L 27/1225* (2013.01); *H01L 27/1248* (2013.01); *H01L 27/1262* (2013.01); *H01L 27/3262* (2013.01); *H01L 29/66969* (2013.01); *H01L 29/7869* (2013.01)

(58) Field of Classification Search
CPC ................................................ H01L 29/78606
USPC ............................................................ 257/43
See application file for complete search history.

(56) References Cited

U.S. PATENT DOCUMENTS

2006/0146269 A1* 7/2006 Kim .................. G02F 1/136204
349/158
2010/0032664 A1* 2/2010 Lee ..................... H01L 27/1225
257/43

(Continued)

FOREIGN PATENT DOCUMENTS

| KR | 1020110109885 | 10/2011 |
| KR | 1020120118171 | 10/2012 |
| KR | 1020160027907 | 3/2016 |

*Primary Examiner* — Igwe U Anya
(74) *Attorney, Agent, or Firm* — Cantor Colburn LLP

(57) ABSTRACT

A thin film transistor array panel includes an oxide semiconductor layer disposed on a substrate and includes a source region, a drain region, and a channel region, a gate insulating layer and a gate electrode disposed on the oxide semiconductor layer, source region, and a drain region, a first passivation layer disposed on the gate electrode, a second passivation layer disposed on the first passivation layer, and a source electrode and a drain electrode disposed on the second passivation, and the source electrode is connected with the source region, the drain electrode is connected with the drain region, the first passivation layer and the second passivation layer include the same metal oxide, and an amount of metal included in the first passivation layer is different from an amount of metal included in the second passivation layer.

16 Claims, 9 Drawing Sheets

(56) References Cited

U.S. PATENT DOCUMENTS

| | | | |
|---|---|---|---|
| 2010/0163868 A1* | 7/2010 | Yamazaki | H01L 27/1225 257/43 |
| 2011/0240998 A1* | 10/2011 | Morosawa | H01L 29/41733 257/57 |
| 2011/0297930 A1* | 12/2011 | Choi | G02F 1/133345 257/43 |
| 2012/0001167 A1* | 1/2012 | Morosawa | H01L 29/7869 257/43 |
| 2012/0276694 A1* | 11/2012 | Koezuka | H01L 29/7869 438/151 |
| 2013/0256652 A1* | 10/2013 | Lee | H01L 29/786 257/43 |
| 2014/0117359 A1* | 5/2014 | Yuan | H01L 27/1225 257/59 |
| 2016/0141424 A1* | 5/2016 | Meng | H01L 29/41733 257/43 |
| 2016/0380105 A1* | 12/2016 | Wang | H01L 29/7869 257/43 |

\* cited by examiner

THIN FILM TRANSISTOR ARRAY PANEL AND MANUFACTURING METHOD THEREOF

This application claims priority to Korean Patent Application No. 10-2016-0125246, filed on Sep. 29, 2016, and all the benefits accruing therefrom under 35 U.S.C. § 119, the content of which in its entirety is herein incorporated by reference.

BACKGROUND

(a) Field

Exemplary embodiments of the invention relate to a thin film transistor array panel and a manufacturing method thereof.

(b) Description of the Related Art

A thin film transistor has been used in various electronic devices. For example, the thin film transistor is used as a switching or driving element in a display device such as an organic light emitting diode ("OLED") display device.

In general, the thin film transistor includes a gate electrode, a source electrode, a drain electrode, and a semiconductor layer that is electrically connected to the source electrode and the drain electrode, and the semiconductor layer is an important factor in determination of a characteristic of the thin film transistor.

Such a semiconductor layer may include silicon (Si). Silicon is classified into amorphous silicon and polycrystalline silicon depending on the crystal form thereof. Amorphous silicon has a simple manufacturing process thereof but low charge mobility, which limits manufacturing of high performance thin film transistor. Polycrystalline silicon has high charge mobility, but a crystallization of the silicon is required in the manufacturing process thereof, thereby causing high manufacturing cost and requiring a complicated manufacturing process.

Studies and researches have been conducted on a thin film transistor using an oxide semiconductor which has higher electron mobility and a higher on/off ratio than amorphous silicon and has a lower cost and uniformity than polycrystalline silicon in order to make up for the disadvantages of amorphous silicon and polycrystalline silicon.

SUMMARY

Exemplary embodiments of the invention are directed to a thin film transistor array panel that can prevent a current leakage along a passivation layer due to insufficient oxidization and deterioration of properties of a thin film transistor due to external moisture or outside air, and a method for manufacturing the same.

A thin film transistor array panel according to an exemplary embodiment includes an oxide semiconductor layer that is disposed on a substrate and includes a source region, a drain region, and a channel region, a gate insulating layer and a gate electrode that are disposed on the oxide semiconductor layer, a first passivation layer that is disposed on the gate electrode, the source region, and the drain region, a second passivation layer that is disposed on the first passivation layer, and a source electrode and a drain electrode that are disposed on the second passivation. The source electrode is connected with the source region and the drain electrode is connected with the drain region. The first passivation layer and the second passivation layer include the same metal oxide, and an amount of metal included in the first passivation layer is different from an amount of metal included in the second passivation layer.

In an exemplary embodiment, the first passivation layer and the second passivation layer may respectively include an aluminum oxide, and an amount of aluminum included in the first passivation layer may be smaller than an amount of aluminum included in the second passivation layer.

In an exemplary embodiment, the first passivation layer and the second passivation layer may respectively have a thickness of less than 10 nanometers (nm).

In an exemplary embodiment, the thin film transistor array panel may further include an interlayer insulation layer that is disposed between the first passivation layer and the second passivation layer, and the interlayer insulation layer may include at least one of a silicon oxide (SiOx), a silicon nitride (SiNx), and a silicon oxynitride (SiON).

A thin film transistor array panel according to another exemplary embodiment includes an oxide semiconductor layer disposed on a substrate and includes a source region, a drain region, and a channel region, a gate insulating layer and a gate electrode disposed on the oxide semiconductor layer; a first passivation layer disposed on the gate electrode, the source region, and the drain region, a second passivation layer disposed on the first passivation layer, and a source electrode and a drain electrode disposed on the second passivation. The source electrode is connected with the source region and the drain electrode is connected with the drain region, the first passivation layer and the second passivation layer include different metal oxides, and the first passivation layer includes hydrogen.

In an exemplary embodiment, the first passivation layer may include at least one of a titanium oxide and a zirconium oxide.

In an exemplary embodiment, the second passivation layer may include an aluminum oxide.

In an exemplary embodiment, the first passivation layer and the second passivation layer may respectively have a thickness of about less than 10 nm.

In an exemplary embodiment, the thin film transistor array panel further include an interlayer insulation layer that is disposed between the first passivation layer and the second passivation layer, and the interlayer insulation layer may include at least one of a silicon oxide (SiOx), a silicon nitride (SiNx), and a silicon oxynitride (SiON).

A thin film transistor array panel according to still another exemplary embodiment includes an oxide semiconductor layer disposed on a substrate and includes a source region, a drain region, and a channel region, a gate insulating layer and a gate electrode disposed on the oxide semiconductor layer, a first passivation layer disposed on the gate electrode, the source region, and the drain region, and a source electrode and a drain electrode disposed on the first passivation layer. The source electrode is connected with the source region and the drain electrode is connected with the drain region, the first passivation layer includes at least one of an aluminum oxide, a zirconium oxide, a titanium oxide, a magnesium oxide, a hafnium oxide, a titanium aluminum oxide, and an aluminum magnesium oxide, and a thickness of the first passivation layer is about 10 nm or more.

According to an exemplary embodiment, a method for manufacturing a thin film transistor array panel includes forming an oxide semiconductor pattern on a substrate, forming a gate insulating layer and a gate electrode on the oxide semiconductor pattern, forming a first passivation layer by stacking a first metal layer on the gate electrode and the oxide semiconductor pattern and oxidizing the first metal layer, forming a second passivation layer by stacking a second metal layer on the first passivation layer and oxidizing the second metal layer, and forming a source electrode and a drain electrode on the second passivation layer. A source region and a drain region are formed in areas, which contact the first metal layer, of the oxide semiconductor pattern in the oxidization of the first metal layer, the first passivation layer and the second passivation layer include the same metal oxide, and an amount of metal included in the first passivation layer is different from an amount of metal included in the second passivation layer, and the source electrode is connected with the source region and the drain electrode is connected with the drain region.

In an exemplary embodiment, the first passivation layer and the second passivation layer may respectively include an aluminum oxide, and an amount of metal included in the first passivation layer is smaller than an amount of metal included in the second passivation layer.

In an exemplary embodiment, the first metal layer and the second metal layer may respectively have a thickness of about less than 10 nm.

In an exemplary embodiment, the method for manufacturing the thin film transistor array panel may further include forming an interlayer insulation layer between the first passivation layer and the second passivation layer.

According to another exemplary embodiment, a method for manufacturing a thin film transistor array panel includes forming an oxide semiconductor pattern on a substrate, forming a gate insulating layer and a gate electrode on the oxide semiconductor pattern, forming a first passivation layer by stacking a first metal layer on the gate electrode and the oxide semiconductor pattern and oxidizing the first metal layer, forming a second passivation layer by stacking a second metal layer on the first metal layer and oxidizing the second metal layer, and forming a source electrode and a drain electrode on the second passivation layer. A source region and a drain region are formed in areas, which contact the first metal layer, of the oxide semiconductor pattern in the oxidization of the first metal layer, and the first passivation layer and the second passivation layer include different metal oxides, the first passivation layer further includes hydrogen, and the source electrode is connected with the source region and the drain electrode is connected with the drain region.

In an exemplary embodiment, the second metal layer may be stacked on the first metal layer after stacking the first metal layer, and the first passivation layer and the second passivation layer may be respectively formed by simultaneously oxidizing the first metal layer and the second metal layer.

In an exemplary embodiment, the first passivation layer may include at least one of a titanium oxide and a zirconium oxide, and the second passivation layer includes an aluminum oxide.

In an exemplary embodiment, the first passivation layer and the second passivation layer respectively may have a thickness of about less than 10 nm.

In an exemplary embodiment, the method for manufacturing the thin film transistor array panel may further include forming an interlayer insulation layer between the first passivation layer and the second passivation layer.

According to still another exemplary embodiment, a method for manufacturing a thin film transistor array panel includes forming an oxide semiconductor pattern on a substrate, forming a gate insulating layer and a gate electrode on the oxide semiconductor pattern, forming a first passivation layer by stacking a first metal layer on the gate electrode and oxide semiconductor pattern and oxidizing the first metal layer, and forming a source electrode and a drain electrode on the first passivation layer. A source region and a drain region are formed in areas, which contact the first metal layer, of the oxide semiconductor pattern in the oxidization of the first metal layer, the first passivation layer include at least one of an aluminum oxide, a zirconium oxide, a titanium oxide, a magnesium oxide, a hafnium oxide, a titanium aluminum oxide, and an aluminum magnesium oxide, and a thickness of the first passivation layer is about 10 nm or more, and the source electrode is connected with the source region and the drain electrode is connected with the drain region.

According to the exemplary embodiments, a completely oxidized passivation layer is included such that the thin film transistor can be protected from external moisture or outside air, thereby improving reliability of the thin film transistor array panel.

In addition, a current leakage from a passivation layer due to insufficient oxidization of the passivation layer can be prevented.

DETAILED DESCRIPTION

Figure 1:
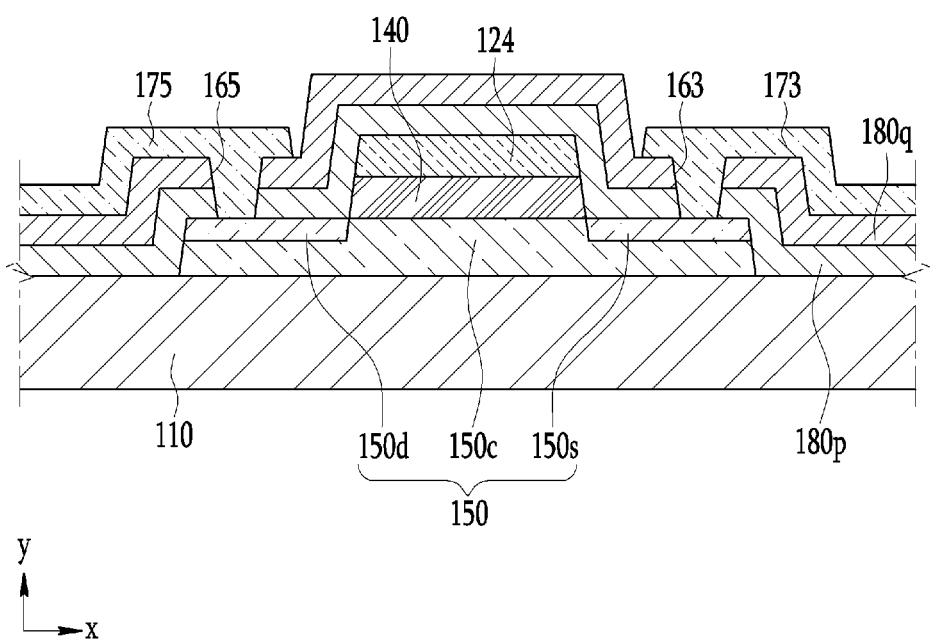
FIG. 1 is a cross-sectional view of an exemplary embodiment of a thin film transistor according to the invention.

Advantages and features of the invention and methods for achieving them will be described more fully hereinafter with reference to the accompanying drawings, in which exemplary embodiments of the invention are shown. As those skilled in the art would realize, the described exemplary embodiments may be modified in various different ways without departing from the spirit or scope of the invention.

The drawings and description are to be regarded as illustrative in nature and not restrictive. Like reference numerals designate like elements throughout the specification.

In addition, the size and thickness of each configuration shown in the drawings are arbitrarily shown for better understanding and ease of description, but the invention is not limited thereto. In the drawings, the thickness of layers, films, panels, regions, etc., are exaggerated for clarity.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Throughout the specification, the word "on" means positioning on or below the object portion, but does not essentially mean positioning on the upper side of the object portion based on a gravitational direction.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items.

In addition, unless explicitly described to the contrary, the word "comprise" and variations such as "comprises" or "comprising" will be understood to imply the inclusion of stated elements but not the exclusion of any other elements.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

In this specification, the phrase "on a plane" means viewing a target portion from the top, and the phrase "on a cross-section" means viewing a cross-section formed by vertically cutting a target portion from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, a thin film transistor array panel according to an exemplary embodiment will be described with reference to FIG. 1. FIG. 1 is a cross-sectional view of an exemplary embodiment of a thin film transistor array panel according to the invention.

An exemplary embodiment of the thin film transistor array panel includes an oxide semiconductor layer 150, a gate insulating layer 140, a gate electrode 124, a source electrode 173, and a drain electrode 175 that are disposed on a substrate 110. A detailed description will follow hereinafter.

In an exemplary embodiment, the substrate 110 may include transparent glass or plastic, for example. In an exemplary embodiment, the substrate 110 may be flat-shaped or include a bendable material.

Although it is not illustrated in the exemplary embodiment, a buffer layer (not shown) may further be disposed between the substrate 110 and the oxide semiconductor 150.

The oxide semiconductor layer 150 is disposed on the substrate 110. The oxide semiconductor layer 150 may be disposed on the substrate 110 with an island shape. The oxide semiconductor layer 150 may overlap the gate electrode 124 and the gate insulating layer 140, and particularly, a channel region 150c of the oxide semiconductor layer 150 may overlap the gate electrode 124 and the gate insulating layer 140.

The oxide semiconductor layer 150 may include an oxide semiconductor material. In an exemplary embodiment, for example, the oxide semiconductor layer 150 may include indium tin zinc oxide ("ITZO"), indium gallium zinc oxide ("IGZO"), and the like.

The oxide semiconductor layer 150 may include the channel region 150c, a source region 150s, and a drain region 150d. The source region 150s and the drain region 150d are disposed at opposite sides of the channel region 150c.

The source region 150s and the drain region 150d may further include a metal. In an exemplary embodiment, for example, the metal may be at least one of aluminum (Al), titanium (Ti), zirconium (Zr), magnesium (Mg), and hafnium (Hf). Alternatively, the metal may be the same as a metal included in a first passivation layer 180p, which will be described later.

The source region 150s and the drain region 150d may be low-resistance regions. The source region 150s and drain region 150d may include a metal that is introduced from the first passivation layer 180p. The source region 150s and the drain region 150d may include a greater amount of metal compared to the channel region 150, and accordingly, the two regions 150s and 150d have lower resistance compared to the channel region 150c.

Each of the source region 150s and the drain region 150d corresponds to a portion of the oxide semiconductor layer 150, which is extended in a thickness direction (i.e., y-axis direction) from an upper surface of the oxide semiconductor layer 150 to a bottom surface of the oxide semiconductor layer 150. Bottom surfaces of the source region 150*s* and the drain region 150*d* may not match the bottom surface of the oxide semiconductor layer 150.

The gate insulating layer 140 is disposed on the channel region 150*c* of the oxide semiconductor layer 150. In an exemplary embodiment, the gate insulating layer 140 may include a material such as a silicon oxide (SiOx), a silicon nitride (SiNx), a silicon oxynitride (SiON), an aluminum oxide (AlOx), and the like. In an exemplary embodiment, the gate insulating layer 140 may be a single layer or a multilayer, for example.

The gate electrode 124 is disposed on the gate insulating layer 140. The gate electrode 124 may control electronic density of the oxide semiconductor layer 150 through a gate voltage applied thereto.

In an exemplary embodiment, the gate electrode 124 may include a low-resistance metal such as silver (Ag), copper (Cu), nickel (Ni), aluminum (Al), molybdenum (Mo), and the like, or an alloy thereof.

Planar edges of the gate electrode 124 and the gate insulating layer 140 may substantially coincide with each other. The planar edges of the gate electrode 124 and the gate insulating layer 140 may vertically overlap each other in a cross-sectional view.

The first passivation layer 180*p* is disposed on the gate electrode 124, the oxide semiconductor layer 150, and the substrate 110.

The first passivation layer 180*p* may be an oxide layer that includes a metal. The first passivation layer 180*p* may be a supply source of the metal that is dispersed into the source region 150*s* and the drain region 150*d*.

In an exemplary embodiment, the first passivation layer 180*p* may include, for example, at least one of an aluminum oxide, a zirconium oxide, a titanium oxide, a magnesium oxide, a hafnium oxide, a titanium aluminum oxide, and an aluminum magnesium oxide.

A thickness of the first passivation layer 180*p* along a thickness direction (i.e., y-axis direction) may be about less than 10 nanometers (nm), and the first passivation layer 180*p* may be a metal oxide layer that is completely oxidized along the thickness direction. The first passivation layer 180*p* may be formed by layering a metal layer and then oxidizing the metal layer. In contrast, if the metal layer has a thickness of about 10 nm or more, oxidization of the metal may not occur in a part of the metal layer. The metal layer that is adjacent to the oxide semiconductor layer 150 along the y-axis direction may not be sufficiently oxidized and thus remain in a metal material state. Leakage of a current that is applied to the thin film transistor may occur in the non-oxidized area, thereby causing characteristic deterioration. However, the first passivation layer 180*p* according to the exemplary embodiment may be completely oxidized along the thickness direction because the first passivation layer 180*p* has a thin thickness of less than about 10 nm.

A second passivation layer 180*q* may be disposed on the first passivation layer 180*p*. In an exemplary embodiment, the second passivation layer 180*q* may include an aluminum oxide, and may be a single layer or a multilayer, for example.

A thickness of the second passivation layer 180*q* may be about less than 10 nm. If the second protective film 180*q* has a thickness of 10 nm or more, it may be difficult to form a uniform oxide layer as mentioned above.

The sum of the thicknesses of the first passivation layer 180*p* and the second passivation layer 180*q* may be about 10 nm or more. When the first passivation layer 180*p* and the second passivation layer 180*q* may have a total thickness of about 10 nm or more, inflow of moisture or air from the outside can be effectively blocked.

That is, the first passivation layer 180*p* and the second passivation layer 180*q* respectively have a thin thickness such that they may include a completely oxidized metal layer respectively. In addition, the first passivation layer 180*p* and the second passivation layer 180*q* may overlap each other with a total thickness enough to protect the thin film transistor.

In the exemplary embodiment, the first passivation layer 180*p* is disposed as a single layer and the second passivation layer 180*q* is disposed as a single layer. However, the invention is not limited thereto. In another embodiment, each of the first and second passivation layers 180*p* and 180*q* may include a plurality of layers.

In an exemplary embodiment, the first passivation layer 180*p* and the second passivation layer 180*q* may include the same metal oxide, and for example, both the first and second passivation layer 180*p* and 180*q* may include an aluminum oxide.

The amount of aluminum included in the first passivation layer 180*p* may be different from the amount of aluminum included in the second passivation layer 180*q*, and specifically, the amount of aluminum included in the first passivation layer 180*p* may be smaller than the amount of aluminum included in the second passivation layer 180*q*. The first passivation layer 180*p* directly contacts the source region 150*s* and the drain region 150*d* of the oxide semiconductor layer 150. A part of the metal material originally included in the metal layer of the first passivation layer 180*p* is introduced into the source region 150*s* and the drain region 150*d* while the metal layer is oxidized such that the amount of the metal material included in the first passivation layer 180*p* becomes smaller than the amount of the metal material included in the second passivation layer 180*q*, even if the original amount of the metal material included in the first passivation layer 180*p* before the oxidization was the same with the amount of the metal material included in the second passivation layer 180*q*.

In another exemplary embodiment, the first passivation layer 180*p* and the second passivation layer 180*q* may include different metal oxides, and for example, the first passivation layer 180*p* may include at least one of a titanium oxide and a zirconium oxide and the second passivation layer 180*q* may include an aluminum oxide. In this case, the first passivation layer 180*p* may further include hydrogen (H).

The titanium oxide and the zirconium oxide have a property of adsorbing hydrogen (H). If the first passivation layer 180*p* includes the titanium oxide or the zirconium oxide, a hydrogen gas that may be introduced into the oxide semiconductor layer 150 during a manufacturing process may be absorbed into the first passivation layer 180*p*. Accordingly, the first passivation layer 180*p* may further include absorbed hydrogen (H).

In general, the oxide semiconductor layer 150 is vulnerable to the hydrogen gas. However if the first passivation layer 180*p* includes the titanium oxide or the zirconium oxide according to the exemplary embodiment, stability of the oxide semiconductor layer 150 with respect to the hydrogen gas can be improved.

The first passivation layer 180*p* and the second passivation layer 180*q* prevents the inflow of moisture and outside air into the oxide semiconductor layer 150, and prevents a leakage current by including the completely oxidized passivation layer such that stability and reliability of the electrical characteristics of the thin film transistor can be improved.

The first passivation layer 180*p* and the second passivation layer 180*q* may define a first contact hole 163 that overlaps at least a portion of the source region 150*s* of the oxide semiconductor layer 150 and a second contact hole 165 that overlaps at least a portion of the drain region 150*d* of the oxide semiconductor layer 150. The source electrode 173 and the drain electrode 175 may be disposed on the second passivation layer 180*q*. The source electrode 173 is connected with the source region 150*s* of the oxide semiconductor layer 150 through the first contact hole 163, and the drain electrode 175 is connected with the drain region 150*d* of the oxide semiconductor layer 150 through second contact hole 165.

The oxide semiconductor layer 150, the gate electrode 124, the source electrode 173, and the drain electrode 175 may comprise a single thin film transistor. An exemplary embodiment of a thin film transistor array panel according to the invention may include a plurality of pixels and a driver that drives the plurality of pixels. The above-described thin film transistor may be used as a switch that is directly connected with each pixel or may be used as a switch that is disposed in the driver in the thin film transistor array panel.

Figure 2:
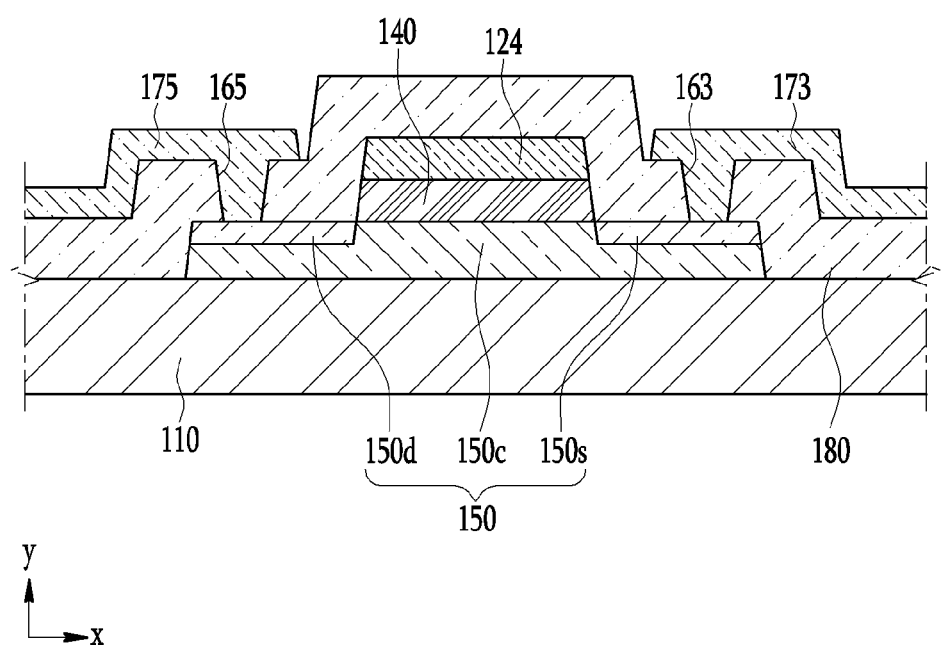
FIG. 2 is a cross-sectional view of an exemplary embodiment of a thin film transistor array panel.
Figure 3:
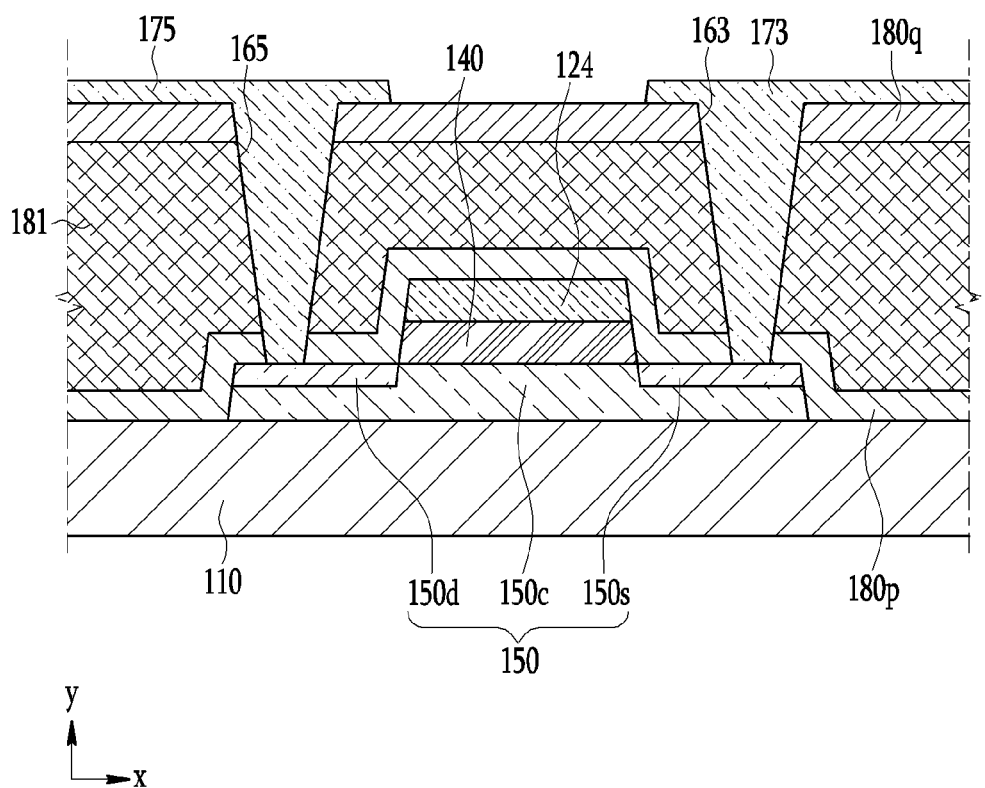
FIG. 3 is a cross-sectional view of another exemplary embodiment of a thin film transistor array panel.

Hereinafter, thin film transistor array panels according to other exemplary embodiments will be described with reference to FIG. 2 and FIG. 3. FIG. 2 is a cross-sectional view of an exemplary embodiment of a thin film transistor array panel which comprises different thin film transistors from the exemplary embodiment of FIG. 1, and FIG. 3 is a cross-sectional view another exemplary embodiment of a thin film transistor array panel which comprises different thin film transistors from the exemplary embodiments of FIGS. 1 and 2. The corresponding elements described in FIG. 1 will be briefly described, and only different elements will be described in detail below.

Referring to FIG. 2, an oxide semiconductor layer 150 is disposed on a substrate 110. The oxide semiconductor layer 150 may include a channel region 150*c*, a source region 150*s*, and a drain region 150*d*, and the source region 150*s* and the drain region 150*d* are disposed at opposite sides of the channel region 150*c*. A gate insulating layer 140 and a gate electrode 124 of which planar edges coincide with each other are disposed on the channel region 150*c* of the oxide semiconductor layer 150. A passivation layer 180 may be disposed on the gate electrode 124, the oxide semiconductor layer 150, and the substrate 110. The passivation layer 180 according to this exemplary embodiment may be disposed as a single layer.

The passivation layer 180 may include a metal oxide. Specifically, a metal included in the passivation layer 180 may include a metal or an alloy having a higher ionization tendency than aluminum. The passivation layer 180 according to an exemplary embodiment includes at least one of an aluminum oxide, a zirconium oxide, a titanium oxide, a magnesium oxide, a hafnium oxide, a titanium aluminum oxide, and an aluminum magnesium oxide. However, the invention is not limited thereto.

The passivation layer 180 has a thickness of about 10 nm or more. Even if the passivation layer 180 has a thickness of about 10 nm or more, the entire layer of the passivation layer 180 can be oxidized sufficiently in a process of oxidizing the metal layer since the passivation layer 180 includes a metal having a high ionization tendency.

A source electrode 173 and a drain electrode 175 are disposed on the passivation layer 180. The source electrode 173 is connected with the source region 150*s* of the oxide semiconductor layer 150 through a first contact hole 163, and the drain electrode 175 is connected with the drain region 150*d* of the oxide semiconductor layer 150 through a second contact hole 165.

Referring to FIG. 3, an oxide semiconductor layer 150 is disposed on a substrate 110. The oxide semiconductor layer 150 may include a channel region 150*c*, a source region 150*s*, and a drain region 150*d*, and the source region 150*s* and the drain region 150*d* are disposed at opposite sides of the channel region 150*c*. A gate insulating layer 140 and a gate electrode 124 of which planar edges coincide with each other are disposed on the channel region 150*c* of the oxide semiconductor layer 150.

A first passivation layer 180*p* may be disposed on the gate electrode 124, the oxide semiconductor layer 150, and the substrate 110. The first passivation layer 180*p* may be a supply source of a metal that is dispersed into the source region 150*s* and the drain region 150*d*, and may be an oxide layer that includes the metal.

In an exemplary embodiment, the first passivation layer 180*p* may include, for example, at least one of an aluminum oxide, a zirconium oxide, a titanium oxide, a magnesium oxide, a hafnium oxide, a titanium aluminum oxide, and an aluminum magnesium oxide.

An interlayer insulation layer 181 may be disposed on the first passivation layer 180*p*. In an exemplary embodiment, the interlayer insulation layer 181 may include at least one of a silicon oxide, a silicon nitride, and a silicon oxynitride, for example.

A second passivation layer 180*q* may be disposed on the interlayer insulation layer 181. In an exemplary embodiment, the second passivation layer 180*q* may include an aluminum oxide, and may be a single layer or a multilayer, for example.

The first passivation layer 180*p*, the interlayer insulation layer 181, and the second passivation layer 180*q* may define a first contact hole 163 that overlaps at least a portion of the source region 150*s* of the oxide semiconductor layer 150 and a second contact hole 165 that overlaps at least a portion of the drain region 150*d* of the oxide semiconductor layer 150.

A source electrode 173 and a drain electrode 175 may be disposed on the second passivation layer 180*q*. The source electrode 173 is connected with the source region 150*s* of the oxide semiconductor layer 150 through the first contact hole 163, and the drain electrode 175 is connected with the drain region 150*d* of the oxide semiconductor layer 150 through the second contact hole 165.

Figure 4:
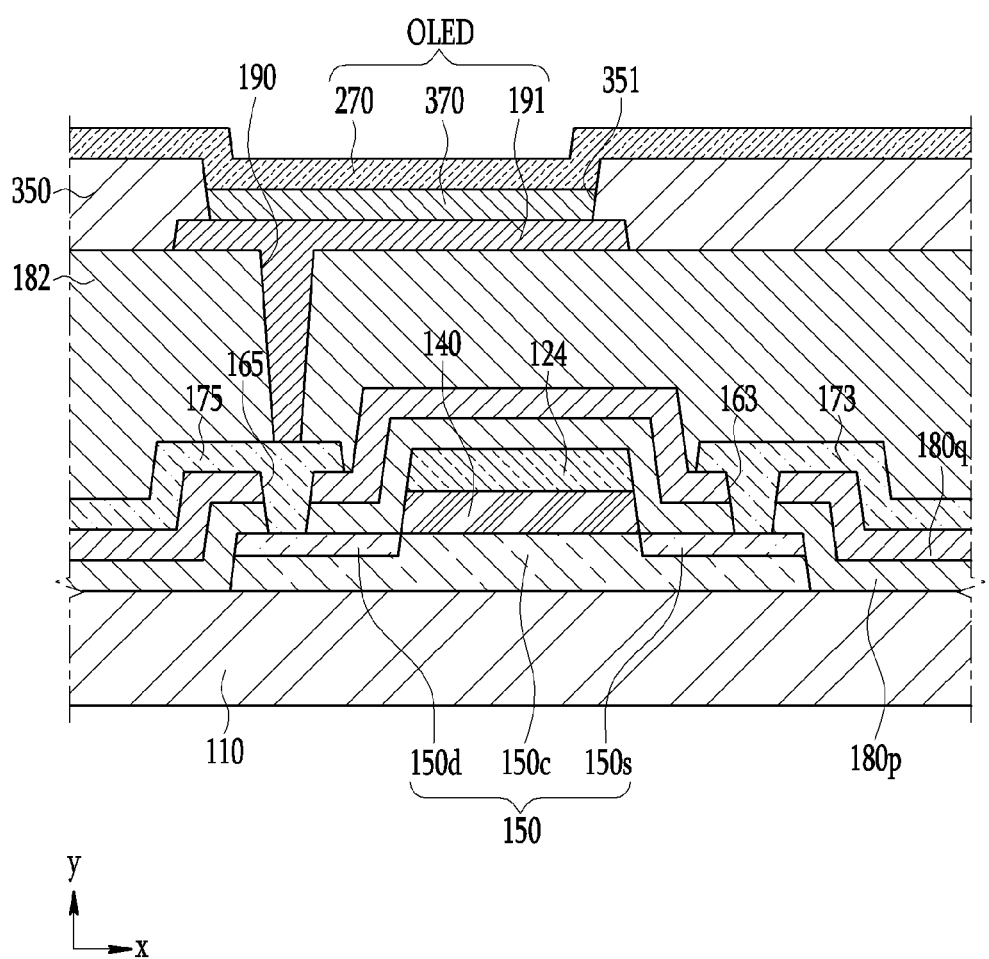
FIG. 4 is a schematic cross-sectional view of an exemplary embodiment of an organic light emitting diode display device that includes a thin film transistor.

Hereinafter, an organic light emitting diode ("OLED") display device that includes that above-described thin film transistor array panel will be described with reference to FIG. 4. FIG. 4 is a schematic cross-sectional view of an exemplary embodiment of an OLED display device that includes the exemplary embodiment of the thin film transistor of FIG. 1. A description of elements that are described above will be omitted, and only elements that are not described will be described in detail below.

In the exemplary embodiment, the OLED display device includes the thin film transistor array panel of FIG. 1. However, the invention is not restrictive. The OLED display device may include the thin film transistor array panel of FIG. 2 or the thin film transistor array panel of FIG. 3, and a liquid crystal display device including the same is also applicable.

The above-described oxide semiconductor layer 150, gate electrode 124, source electrode 173, and drain electrode 175 comprises a single thin film transistor. In an exemplary embodiment, the above-described thin film transistor may be a switching transistor or a driving transistor, for example. A substrate 110 where such a thin film transistor is disposed is called a thin film transistor array panel.

Referring to FIG. 4, a third passivation layer 182 may be disposed on the second passivation layer 180q, the source electrode 173, and the drain electrode 175. The third passivation layer 182 may define a third contact hole 190 that overlaps at least a portion of the drain electrode 175.

A pixel electrode 191 may be disposed on the third passivation layer 182. In an exemplary embodiment, the pixel electrode 191 may include a transparent conductive material such as indium-tin oxide ("ITO"), indium-zinc oxide ("IZO"), zinc oxide (ZnO), indium oxide ($In_2O_3$), and the like, or a reflective metal such as lithium (Li), calcium (Ca), lithium fluoride-co-calcium (LiF-co-Ca), lithium fluoride-co-aluminum (LiF-co-Al), aluminum (Al), silver (Ag), magnesium (Mg), gold (Au), and the like.

The pixel electrode 191 is electrically connected with the drain electrode 175 through the third contact hole 190, and thus may become an anode of an OLED.

A pixel defining layer 350 may be disposed on the third passivation layer 182. The pixel defining layer 350 defines a pixel opening 351 that overlaps the pixel electrode 191. In an exemplary embodiment, the pixel defining layer 350 may include a resin such as a polyacrylic or polyimide resin, and a silica-based inorganic material or an organic material.

An organic emission layer 370 is disposed in the pixel opening 351 of the pixel defining layer 350. The organic emission layer 370 may include at least one of an emission layer, a hole injection layer (HIL), a hole transport layer (HTL), an electron transport layer (ETL), and an electron injection layer (EIL), for example.

The organic emission layer 370 may include a red organic emission layer that emits red light, a green organic emission layer that emits green light, and a blue organic emission layer that emits blue light without overlapping each other. The red organic emission layer, the blue organic emission layer, and the green organic emission layer are respectively disposed in a red pixel, a green pixel, and a blue pixel to emit a color image.

In another exemplary embodiment, the organic emission layer 370 may include all of the red organic emission layer, the green organic emission layer, and the blue organic emission layer which are laminated together on the red pixel, the green pixel, and the blue pixel, and a red color filter, a green color filter, and a blue color filter are disposed for respective pixels. Therefore, the organic emission layer 370 implements the color image. In still another exemplary embodiment, a white organic emission layer emitting white light is disposed in all of the red pixel, the green pixel, and the blue pixel, and a red color filter, a green color filter, and a blue color filter are disposed for respective pixels. Therefore, the white organic emission layer and the color filters implement the color images. In the case of implementing the color image by using the white organic emission layer and the color filters, it is not required to use a deposition mask for depositing the red organic emission layer, the green organic emission layer, and the blue organic emission layer on respective pixels, which are the red pixel, the green pixel, and the blue pixel.

The white organic emission layer described in the still another exemplary embodiment may be provided by one organic emission layer, or may include a configuration provided so as to emit white light by laminating a plurality of organic emission layers. In an exemplary embodiment, for example, a configuration which may emit white light by combining at least one yellow organic emission layer and at least one blue light emitting layer, a configuration which may emit white light by combining at least one cyan organic emission layer and at least one red light emitting layer, a configuration which may emit white light by combining at least one magenta organic emission layer and at least one green light emitting layer, and the like may be included. However, exemplary embodiments are not limited thereto.

A common electrode 270 is disposed on the pixel defining layer 350 and the organic emission layer 370. In an exemplary embodiment, the common electrode 270 may include a transparent conductive material such as ITO, IZO, zinc oxide (ZnO), indium oxide ($In_2O_3$), and the like, or a reflective metal such as lithium (Li), calcium (Ca), lithium fluoride-co-calcium (LiF-co-Ca), lithium fluoride-co-aluminum (LiF-co-Al), aluminum (Al), silver (Ag), magnesium (Mg), or gold (Au). The common electrode 270 becomes a cathode of the OLED. The pixel electrode 191, the organic emission layer 370, and the common electrode 270 comprise the OLED.

Hereinafter, an exemplary embodiment of a method for manufacturing a thin film transistor array panel according to the invention will be described with reference to FIG. 5 to FIG. 9, together with FIG. 3. FIG. 5, FIG. 6, FIG. 7, FIG. 8, and FIG. 9 are cross-sectional views illustrating an exemplary embodiment of a method for manufacturing a thin film transistor array panel according to the invention.

Figure 5:
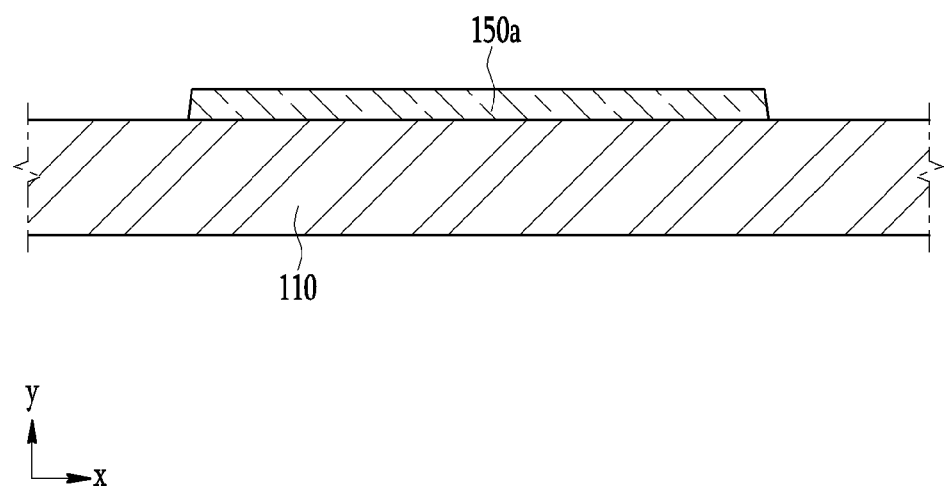
FIGS. 5, 6, 7, 8 and 9 are cross-sectional views of an exemplary embodiment of a manufacturing process of a thin film transistor.

As shown in FIG. 5, an oxide semiconductor pattern 150a is formed on a substrate 110. The oxide semiconductor pattern 150a may be formed by stacking an oxide semiconductor material layer on the substrate 110 and patterning the oxide semiconductor material.

Figure 6:
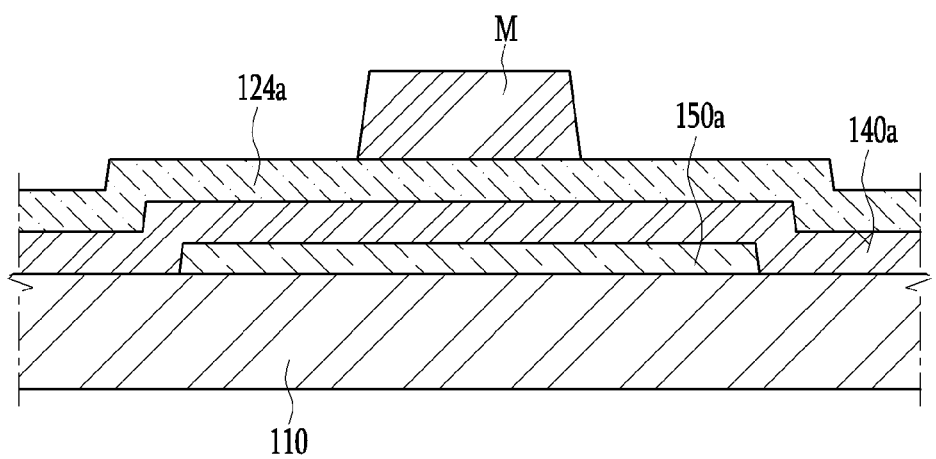

Next, referring to FIG. 6, a gate insulation material layer 140a and a gate electrode material layer 124a are sequentially stacked on the substrate 110 and the oxide semiconductor pattern 150a, and a photosensitive pattern M is formed on the gate electrode material layer 124a.

In an exemplary embodiment, the gate insulation material layer 140a may include at least one of a silicon nitride (SiNx), a silicon oxide (SiOx), and a silicon oxynitride (SiON), and the gate electrode material layer 124a may include a metal conductive material.

In an exemplary embodiment, the gate insulation material layer 140a may be formed using, for example, a chemical vapor deposition ("CVD") method, a reactivity sputtering method, an atomic layer deposition method, and the like, and the gate electrode material layer 124a may be formed using a sputtering method. However, the methods to form the layers are not limited thereto. In addition, the photosensitive pattern M may be formed by stacking a photosensitive material on the gate electrode material layer 124a and patterning the photosensitive material.

Figure 7:
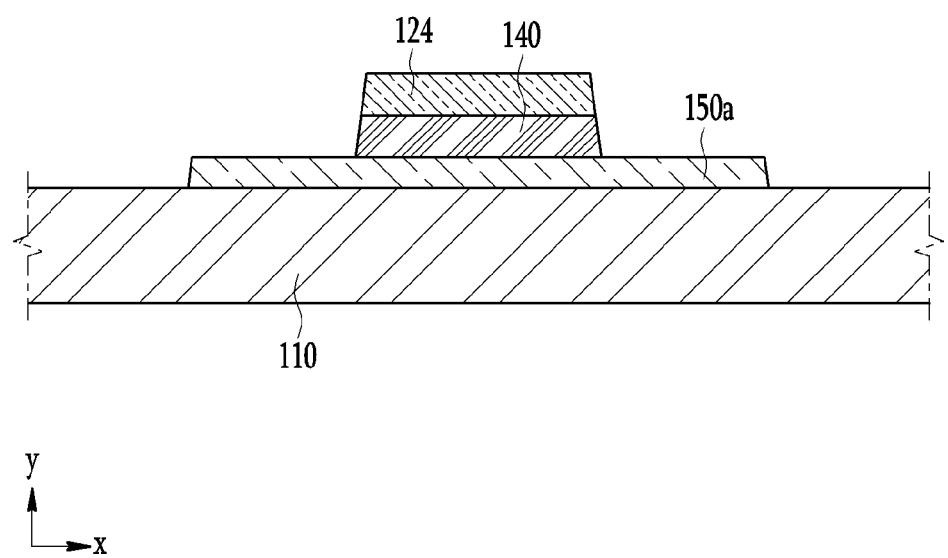

Then, as shown in FIG. 7, a gate insulating layer 140 and a gate electrode 124 are formed on the oxide semiconductor pattern 150a.

The gate electrode 124 is formed by etching the gate electrode material layer 124a (refer to FIG. 6) using the photosensitive pattern M as a mask, and the gate insulating layer 140 is formed by etching the gate insulation material layer 140a (refer to FIG. 6) using the photosensitive pattern M as a mask. After that, the photosensitive pattern M is removed.

Planar edges of the gate electrode 124 and the gate insulating layer 140 may substantially coincide with each other. The planar edges of the gate electrode 124 and the gate insulating layer 140 may vertically overlap each other in a cross-sectional view.

Figure 8:
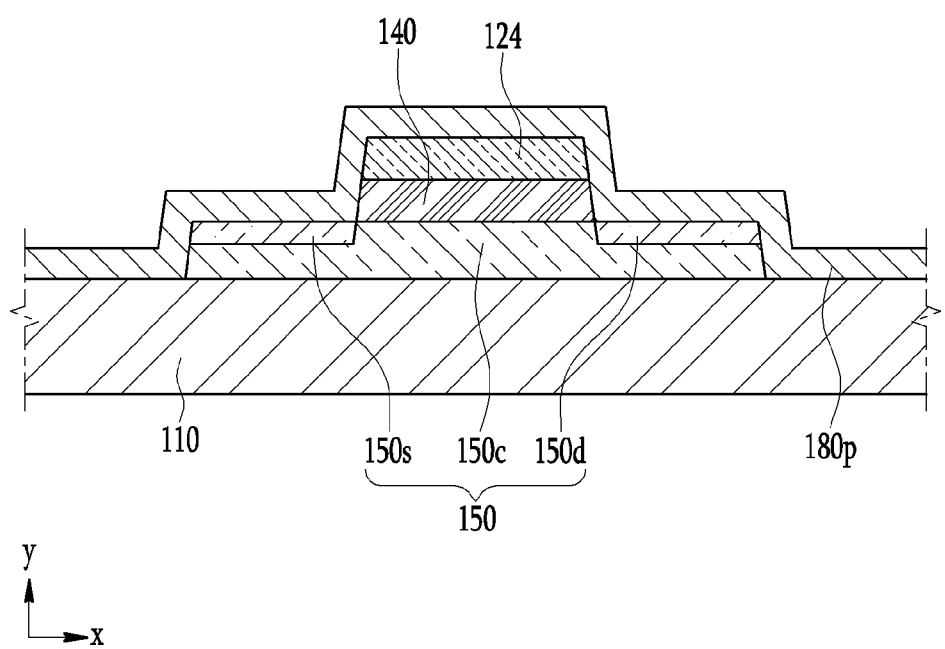

Referring to FIG. 8, a first passivation layer 180p is disposed on the gate electrode 124 and the oxide semiconductor pattern 150a (refer to FIG. 7), and subsequently, an oxide semiconductor layer 150 that includes a source region 150s, a drain region 150d, and a channel region 150c is formed.

The first passivation layer 180p may include a metal layer that is oxidized by performing an oxidization process on a first metal layer that is disposed on the oxide semiconductor pattern 150a (refer to FIG. 7). In an exemplary embodiment, the oxidization process may be an annealing process or a plasma oxidization process. However, the oxidization processes are not limited thereto.

In an exemplary embodiment, the first metal may be formed by depositing at least one of aluminum, zirconium, magnesium, hafnium, aluminum-titanium, aluminum-magnesium, and titanium using a sputtering method, for example.

The first metal layer may have a thickness of about less than 10 nm. If the thickness of the first metal is about 10 nm or more, the first metal layer may not be uniformly oxidized during the oxidization process.

The source region 150s and the drain region 150d of the oxide semiconductor layer 150 may be formed by introducing a metal that is included in the first metal layer during the oxidization process. The metal introduced into the oxide semiconductor pattern 150a (refer to FIG. 7) causes the oxide semiconductor pattern 150a to be partially low-resistive, and the low resistance area of the oxide semiconductor pattern 150a may become the source region 150s and the drain region 150d, respectively.

The channel region 150c is disposed between the source region 150s and the drain region 150d. The metal material may be hardly introduced into the channel region 150c because the channel region 150c is blocked by the gate electrode 124 and the gate insulating layer 140 that are disposed on the oxide semiconductor layer 150.

Figure 9:
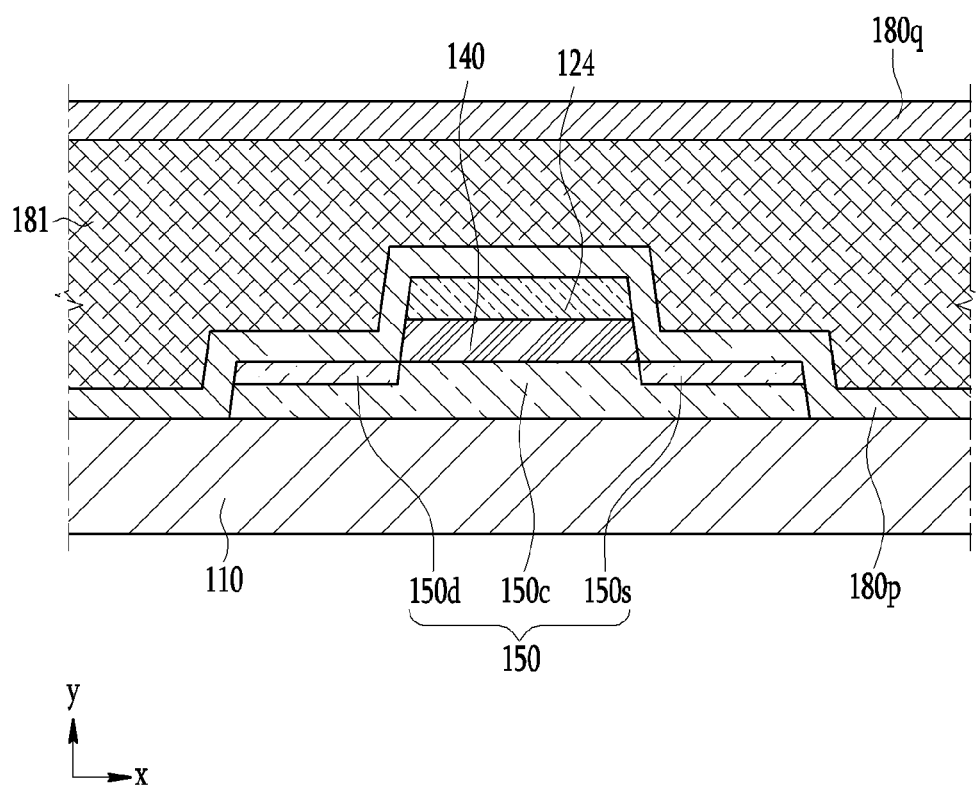

Next, as shown in FIG. 9, an interlayer insulation layer 181 and a second passivation layer 180q are disposed on the first passivation layer 180p. The second passivation layer 180q may be formed using the same method as the first passivation layer 180p.

Specifically, a second metal layer is stacked on the interlayer insulation layer 181 and an oxidization process (e.g., an annealing process or a plasma process) is performed on the second metal layer such that the second passivation layer 180q that includes the oxidized metal layer may be formed. However, the second metal layer does not directly contact the oxide semiconductor layer 150 and therefore no metal material is introduced into the oxide semiconductor layer 150 from the second metal layer in the second passivation layer 180q.

Next, a first contact hole 163 and a second contact hole 165 are defined in the second passivation layer 180q, the interlayer insulation layer 181, and the first passivation layer 180p. Subsequently, A source electrode 173 that is connected to the source region 150s through the first contact hole 163 and a drain electrode 175 that is connected to the drain region 150d through the second contact hole 165 are formed such that the thin film transistor array panel shown in FIG. 3 is provided.

The source electrode 173 and the drain electrode 175 are formed by depositing a metal material on the second passivation layer 180q and patterning the metal material.

In the exemplary embodiment, an exemplary embodiment of a method for manufacturing the thin film transistor array panel shown in FIG. 3 is described. However, the exemplary embodiment of the thin film transistor array panel of FIG. 1 may be manufactured using the same process used in manufacturing the thin film transistor array panel shown in FIG. 3 except for forming the interlayer insulation layer 181. The exemplary embodiment of the thin film transistor array panel of FIG. 2 may be manufacturing using the same process used in manufacturing the thin film transistor array panel shown in FIG. 3 except for forming the interlayer insulation layer 181 and the second passivation layer 180q.

However, if the first passivation layer 180p includes a titanium oxide and the second passivation layer 180q includes an aluminum oxide, the manufacturing process thereof will be partially different from the above-described manufacturing method.

Specifically, a first metal layer that includes titanium is stacked first and then, without an oxidization process of the first metal layer, a second metal layer that includes aluminum is stacked. After that, the second metal layer that includes aluminum and the first metal layer that includes titanium are simultaneously oxidized to form a second passivation layer 180q that includes an aluminum oxide and a first passivation layer 180p that includes a titanium oxide respectively.

In the thin film transistor array panel that is manufactured using the above-described method, when a gate voltage is applied to the gate electrode 124, a current is generated in the channel region 150c of the oxide semiconductor layer 150. In this case, since the source region 150s and the drain region 150d are low-resistance regions that include a metal material, an electrical characteristic of the thin film transistor element can be stabilized.

The first passivation layer disposed for forming the low-resistive region has a sufficiently thin thickness, and therefore when the low-resistive region is formed, a metal oxide layer that is completely oxidized can be simultaneously disposed. Accordingly, the oxide semiconductor layer can be effectively blocked from moisture or outside air such that a stable thin film transistor can be provided.

While this invention has been described in connection with what is presently considered to be practical exemplary embodiments, it is to be understood that the invention is not limited to the disclosed exemplary embodiments, but, on the contrary, is intended to cover various modifications and equivalent arrangements included within the spirit and scope of the appended claims.

DESCRIPTION OF SYMBOLS

110: substrate
124: gate electrode
140: gate insulating layer
150: oxide semiconductor layer
173: source electrode
175: drain electrode
180p: first passivation layer
180q: second passivation layer

What is claimed is:
1. A thin film transistor array panel comprising:
an oxide semiconductor layer disposed on a substrate and comprises a source region, a drain region, and a channel region;
a gate insulating layer and a gate electrode disposed on the oxide semiconductor layer;

a first passivation layer disposed on the gate electrode, the source region, and the drain region;
a second passivation layer disposed on the first passivation layer; and
a source electrode and a drain electrode disposed on the second passivation layer, the source electrode being connected with the source region and the drain electrode being connected with the drain region,
wherein the first passivation layer and the second passivation layer comprise the same metal oxide, and
an amount of metal included in the first passivation layer is different from an amount of metal included in the second passivation layer,
wherein the first passivation layer and the second passivation layer overlap the gate electrode, and
the first passivation layer and the second passivation layer respectively have a thickness of about less than 10 nanometers.

2. The thin film transistor array panel of claim 1, wherein the first passivation layer and the second passivation layer respectively comprise an aluminum oxide, and an amount of aluminum included in the first passivation layer is smaller than an amount of aluminum included in the second passivation layer.

3. The thin film transistor array panel of claim 1, further comprising an interlayer insulation layer disposed between the first passivation layer and the second passivation layer, and the interlayer insulation layer comprises at least one of a silicon oxide (SiOx), a silicon nitride (SiNx), and a silicon oxynitride (SiON).

4. A thin film transistor array panel comprising:
an oxide semiconductor layer disposed on a substrate and includes a source region, a drain region, and a channel region;
a gate insulating layer and a gate electrode disposed on the oxide semiconductor layer;
a first passivation layer disposed on the gate electrode, the source region, and the drain region;
a second passivation layer disposed on the first passivation layer; and
a source electrode and a drain electrode disposed on the second passivation layer, the source electrode being connected with the source region and the drain electrode being connected with the drain region,
wherein the first passivation layer and the second passivation layer comprise different metal oxides, and
the first passivation layer comprises hydrogen, and
wherein the first passivation layer and the second passivation layer overlap the gate electrode, and
the first passivation layer and the second passivation layer respectively have a thickness of about less than 10 nanometers.

5. The thin film transistor array panel of claim 4, wherein the first passivation layer comprises at least one of a titanium oxide and a zirconium oxide.

6. The thin film transistor array panel of claim 4, wherein the second passivation layer comprises an aluminum oxide.

7. The thin film transistor array panel of claim 4, further comprising an interlayer insulation layer which is disposed between the first passivation layer and the second passivation layer, and the interlayer insulation layer comprises at least one of a silicon oxide (SiOx), a silicon nitride (SiNx), and a silicon oxynitride (SiON).

8. A method for manufacturing a thin film transistor array panel, comprising:
forming an oxide semiconductor pattern on a substrate;
forming a gate insulating layer and a gate electrode on the oxide semiconductor pattern;
forming a first passivation layer by stacking a first metal layer on the gate electrode and the oxide semiconductor pattern and oxidizing the first metal layer;
forming a second passivation layer by stacking a second metal layer on the first passivation layer and oxidizing the second metal layer; and
forming a source electrode and a drain electrode on the second passivation layer,
wherein
a source region and a drain region are formed in areas, which contact the first metal layer, of the oxide semiconductor pattern in the oxidization of the first metal layer,
the first passivation layer and the second passivation layer comprise the same metal oxide, and an amount of metal included in the first passivation layer is different from an amount of metal included in the second passivation layer, and
the source electrode is connected with the source region and the drain electrode is connected with the drain region,
wherein the first passivation layer and the second passivation layer overlap the gate electrode, and
the first passivation layer and the second passivation layer respectively have a thickness of about less than 10 nanometers.

9. The method for manufacturing the thin film transistor array panel of claim 8, wherein the first passivation layer and the second passivation layer respectively comprise an aluminum oxide, and an amount of metal included in the first passivation layer is smaller than an amount of metal included in the second passivation layer.

10. The method for manufacturing the thin film transistor array panel of claim 8, further comprising forming an interlayer insulation layer between the first passivation layer and the second passivation layer.

11. A method for manufacturing a thin film transistor array panel, comprising:
forming an oxide semiconductor pattern on a substrate;
forming a gate insulating layer and a gate electrode on the oxide semiconductor pattern;
forming a first passivation layer by stacking a first metal layer on the gate electrode and the oxide semiconductor pattern and oxidizing the first metal layer;
forming a second passivation layer by stacking a second metal layer on the first metal layer and oxidizing the second metal layer; and
forming a source electrode and a drain electrode on the second passivation layer,
wherein
a source region and a drain region are formed in areas, which contact the first metal layer, of the oxide semiconductor pattern in the oxidization of the first metal layer,
the first passivation layer and the second passivation layer comprise different metal oxides, and the first passivation layer further comprises hydrogen, and
the source electrode is connected with the source region and the drain electrode is connected with the drain region.

12. The method for manufacturing the thin film transistor array panel of claim 11,
wherein
the second metal layer is stacked on the first metal layer after stacking the first metal layer, and the first passivation layer and the second passivation layer are respectively formed by simultaneously oxidizing the first metal layer and the second metal layer.

13. The method for manufacturing the thin film transistor array panel of claim 11,
wherein
the first passivation layer comprises at least one of a titanium oxide and a zirconium oxide, and
the second passivation layer comprises an aluminum oxide.

14. The method for manufacturing the thin film transistor array panel of claim 11, wherein the first passivation layer and the second passivation layer respectively have a thickness of about less than 10 nanometers.

15. The method for manufacturing the thin film transistor array panel of claim 11, further comprising forming an interlayer insulation layer between the first passivation layer and the second passivation layer.

16. A method for manufacturing a thin film transistor array panel, comprising;
forming an oxide semiconductor pattern on a substrate;
forming a gate insulating layer and a gate electrode on the oxide semiconductor pattern;
forming a first passivation layer by stacking a first metal layer on the gate electrode and oxide semiconductor pattern and oxidizing the first metal layer; and
forming a source electrode and a drain electrode on the first passivation layer,
wherein
a source region and a drain region are formed in areas, which contact the first metal layer, of the oxide semiconductor pattern in the oxidization of the first metal layer, and
the first passivation layer comprises at least one of a zirconium oxide, a magnesium oxide, a hafnium oxide, a titanium aluminum oxide, and an aluminum magnesium oxide, and a thickness of the first passivation layer is about 10 nanometers or more, and
the source electrode is connected with the source region and the drain electrode is connected with the drain region, and
the first passivation layer disposed between the source region and the source electrode and between the drain region and the drain electrode.

* * * * *